United States Patent [19]

Goertzel

[11] Patent Number: 4,672,539
[45] Date of Patent: Jun. 9, 1987

[54] FILE COMPRESSOR

[75] Inventor: Gerald Goertzel, White Plains, N.Y.

[73] Assignee: International Business Machines Corp., Armonk, N.Y.

[21] Appl. No.: 724,234

[22] Filed: Apr. 17, 1985

[51] Int. Cl.[4] .............................................. G06F 1/00
[52] U.S. Cl. ..................................................... 364/300
[58] Field of Search ........................................ 364/300

[56] References Cited

U.S. PATENT DOCUMENTS

| | | | |
|---|---|---|---|
| 3,643,226 | 2/1972 | Loizides et al. | 364/900 |
| 3,694,813 | 9/1972 | Loh et al. | 364/200 |
| 4,103,287 | 7/1978 | Frank | 382/56 |
| 4,355,306 | 10/1982 | Mitchell | 364/900 X |
| 4,369,463 | 1/1983 | Anastassiou et al. | 358/135 |
| 4,410,916 | 10/1983 | Pratt et al. | 358/263 |
| 4,420,771 | 12/1983 | Pirsch | 358/261 |
| 4,545,032 | 10/1985 | Mak | 364/300 X |

OTHER PUBLICATIONS

Schuegraf, "Compression of Large Inverted Files With Hyperbolic Term Distribution", *Information Processing & Management*, vol. 12, pp. 177–184, Pergamon Press, 1976.

Usubuchi et al, "Adaptive Predictive Coding for Newspaper Facsimile", *Proceedings of the IEEE*, vol. 68, No. 7, Jul. 1980, pp. 807–813.

*Primary Examiner*—Raulfe B. Zache
*Attorney, Agent, or Firm*—C. Lamont Whitham

[57] ABSTRACT

An adaptive method of file compression is based on the recognition that language can be thought of as a stream of alternating words and separators. Empty dictionaries are created for the words and separators. For each event in the data stream, a determination is made whether the word is in the dictionary for words compiled from the previously encountered words or whether the word is a new word. If the event is a separator, a similar determination is made using the dictionary for separators. If the event is a new word or a new separator, the event is encoded with a predetermined new word or new separator symbol followed by encoding the characters of the word or separator. A count is maintained of all word events and a count is maintained of all separator events as those events are encoded. In addition, individual counts for each occurence of a word and each occurence of a separator are maintained. The ratio of the number of times a word has been encountered to the total number of words encountered is used to estimate the probability of the word. Similarly, the ratio of the number of times a separator has been encountered is used to estimate the probability of the separator. These probabilities are used with a coding scheme, such as arithmetic coding, to code the words and separators in the two dictionaries.

3 Claims, 4 Drawing Figures

Event counts are updated by traversing tree from the top to the event

Each node value is increased by 1 if the path goes down to the left from the node The leaf count is increased by 1

The value of $C(i-1)$ for event $i$ is given by the sum of the values of the nodes through which the path goes down to the right For $i=5$, $C(5)-C(0)=[C(4)-C(0)]+[C(5)-C(4)]$
$C(6)-C(4)$ and $C(6)-C(5)$ are increased by 1

4,672,539

FILE COMPRESSOR

DESCRIPTION

1. Technical Field

This invention generally relates to a method of compressing computer data files and, more particularly, to an adaptive method of compressing character data wherein the data is divided into words and separators. The file compressor according to the invention is intended for use on files containing language, either computer programs or natural language.

2. Prior Art

The problem of designing a compressor may be separated into two parts. The first is the construction of a model of the source document. For any such model, there is a theoretical minimum size for the compressed document, the so-called entropy limit. It is then necessary to formulate a practical coding scheme which will give actual compression close to the theoretical value.

For non-adaptive models, i.e. models whose characteristics are independent of the document being transmitted, Huffman coding will often be quite efficient. For adaptive models, the coding scheme must also change during the coding process. Adaptive Huffman coding is then required. While such schemes have been built and used, a faster method of coding is desirable.

SUMMARY OF THE INVENTION

It is therefore an object of the present invention to provide a new file compression method which is both fast and achieves a greater degree of compression than known in the prior art.

According to the invention, an adaptive method of file compression is achieved by noting that written language can be thought of as a stream of alternating words and separators. To begin with, empty dictionaries are created for the words and separators. For each event in the data stream, a determination is made whether the event is a word or a separator. If the event is a word, a determination is made as to whether the word is in the dictionary for words compiled from the previously encountered words or whether the word is a new word. If the event is a separator, a similar determination is made using the dictionary for separators. If the event is a new word or a new separator, the event is encoded with a predetermined new word or new separator symbol followed by encoding the characters of the word or separator. A count is maintained of all word events and a count is maintained of all separator events as those events are encoded. In addition, individual counts for each occurence of a word and each occurence of a separator are maintained. The ratio of the number of times a word has been encountered to the total number of words encountered is used to estimate the probability of the word. Similarly, the ratio of the number of times a separator has been encountered to the total number of separators encountered is used to estimate the probability of the separator. These probabilities are used with an efficient coding scheme to code the words and separators in the two dictionaries. Arithmetic coding is used in the practical implementation of the file compressor according to the invention.

BRIEF DESCRIPTION OF THE DRAWINGS

The invention will be better understood from the following detailed description of the preferred embodiment with reference to the drawings, in which.

DETAILED DESCRIPTION OF THE PREFERRED EMBODIMENT OF THE INVENTION

The model used in the practice of the invention has the following characteristics. It is assumed that the data to be transmitted consists of a sequence of events, the events being coded one at a time, starting with the first event, then the second, and so forth. When it is time to code the n'th event, the model produces (1) the relevant event set and (2) the probability of each event. In doing so, the model may make use of its knowledge of all previous events, but may not take into account the specific n'th event or any as yet not encoded event. This restriction means that a copy of the model in the decoder can have the same information as that in the encoder.

The model is adaptive; i.e., event frequencies are accumulated as the file is encoded. The probabilities are rational fractions, and the probability of a given event is the ratio of its count to the total count for the relevant event set. Thus, the probabilities used change during the coding process.

A feature of the model is its selection of the appropriate event set to be used at any step in the coding process. The model may be thought of as a finite state machine.

In the dictionary model, a file is treated as a sequence of records. Each record contains an alternating sequence of "words" and "separators", where a word is a string of alphanumeric characters and a separator is a string of non-alphanumeric characters. In many documents, the single space will be the dominant separator.

Figure 1:
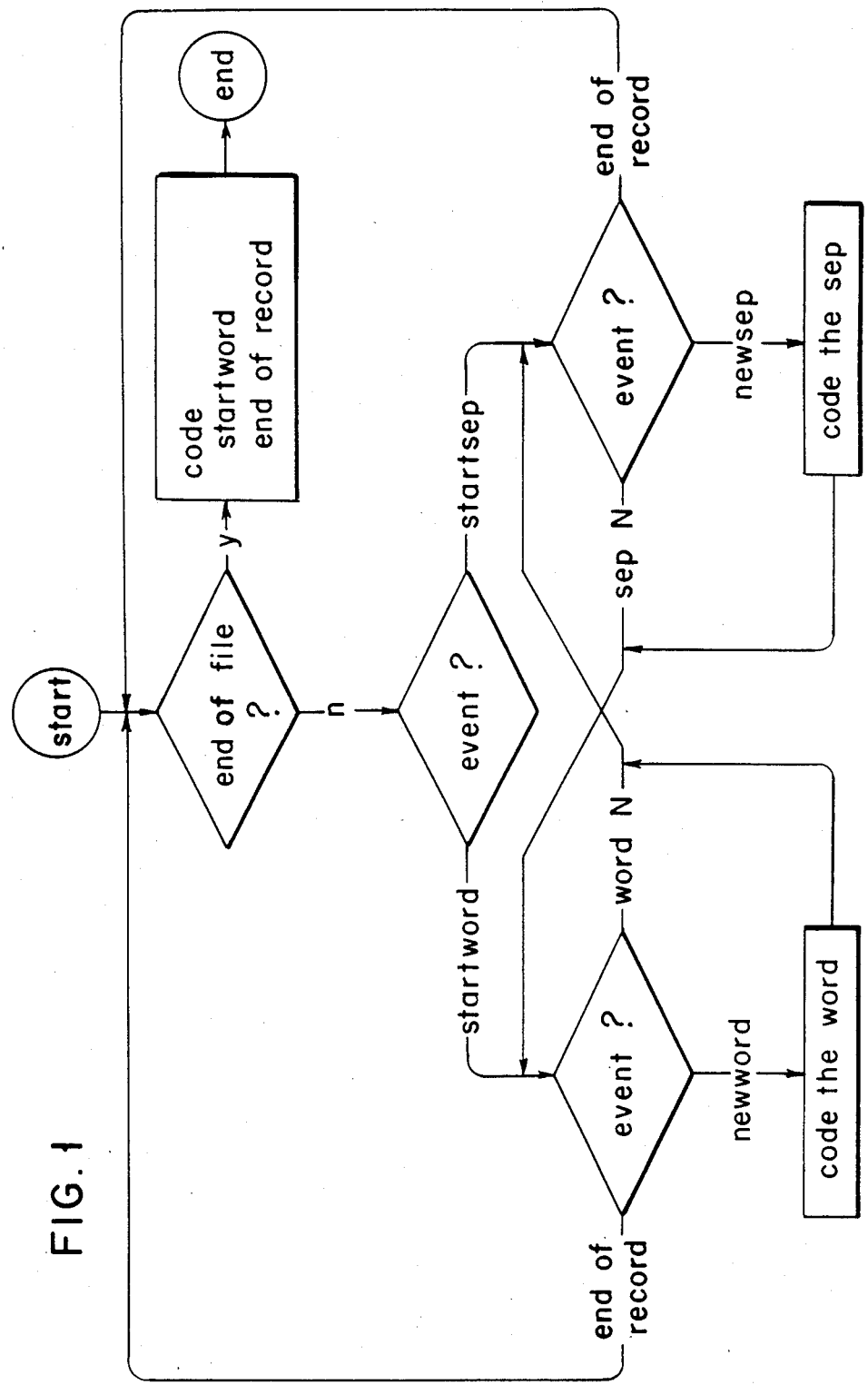
FIG. 1 is a flow diagram of the file compressor according to the invention.

The coding process is diagrammed in FIG. 1. A record is read from the input file. The record will start with a separator or a word. Thus, the first event set consists of the two possibilities startword or startsep. The appropriate event of the pair is coded. The count of the encountered event is increased by one. When a word is expected, the possible event is one of the following:

| | |
|---|---|
| new word | (code "newword") |
| old word N (N = 1, 2,...) | (code "word N") |
| end of record | (code "end of record") |

After the appropriate event is coded, the count for that event is increased by one.

Figure 2:
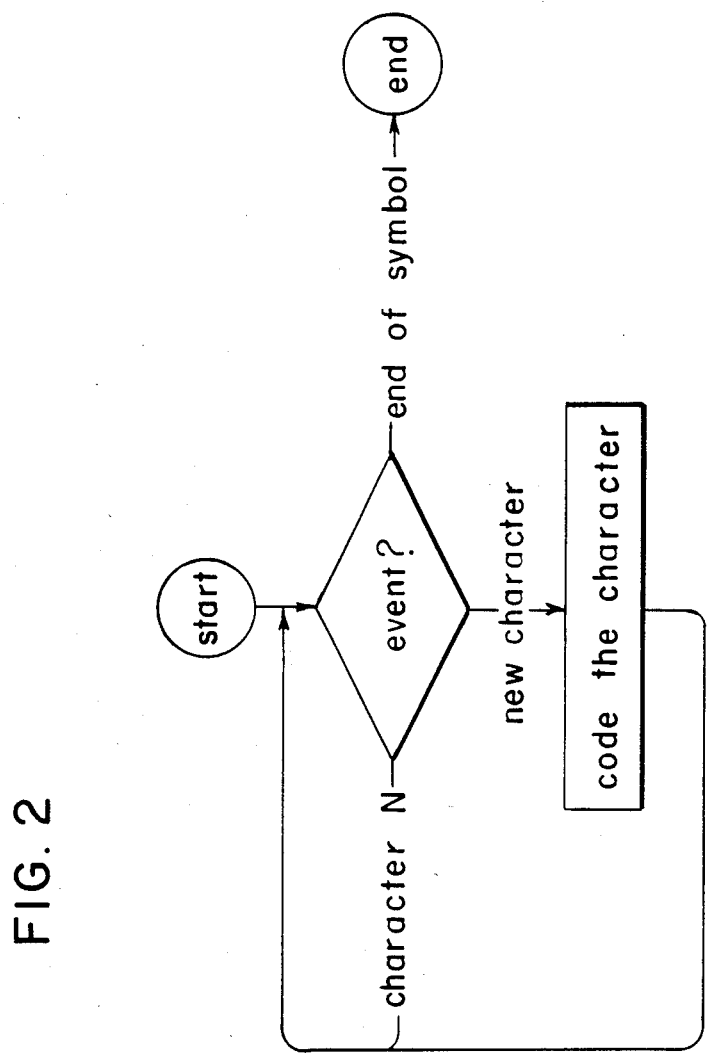
FIG. 2 is a flow diagram illustrating the process of coding new words and separators.

The old word event is one in which the word to be coded has previously been encountered and stored in the dictionary. N is the accession number. The new word event requires further action. The word must be entered in the dictionary, with a count of one, and must also be coded. The coding process for the word is shown in FIG. 2. FIG. 2 also applies to separators, so that the generic term "symbol" is used. The symbol is coded one character at a time. The event set is as follows:

| | |
|---|---|
| character N | (previously encountered character) (code "character N") |
| new character | (code "new character") |
| end of symbol | (no more characters in symbol) (code "end of symbol") |

After the event is coded, the appropriate count is increased by one. When a new character is encountered, it must also be coded. This is done by assuming all new characters (0 to 255) are equally likely. The count for the specific character is set to one. It is important to note that separate tables are kept for the characters in words and in separators. After a word, unless the end of a record has been encountered, a separator is expected. Separators are treated similarly to words, but they have their own dictionary and statistics.

The program switches between words and separators until the end of the input record is reached. The end of record event is coded and a new record is read. The coding process is repeated, beginning with the code to indicate whether the record starts with a word or a separator. At the end of the file, the startword and end of record events are transmitted. This denotes an empty record, which is used as the end of a file.

The practical implementation of the invention uses arithmetic coding. The arithmetic coding process is first described as if arithmetic may be carried out with unlimited precision. The details of a practical algorithm are given later.

To code an event, the input data required are the counts of each of the possible events, in some arbitrary order (known to both the compressor and the decompressor), and the particular event to be coded. The variable n denotes the event number. n starts at one and is increased by one as each event is coded.

Let $c(i,n) > 0$, where $i = 1, 2, \ldots, I(n)$, be the set of counts for the $I(n)$ possible choices for the n'th event. Define the cumulative counts as follows:

$$C(i,n) = c(l,n) + \ldots + c(i,n), \quad (1)$$

where $i = 1, 2, \ldots, I(n)$, and $C(0, n) = 0$.

C is, by definition, a monotonic increasing function of i. The input to the arithmetic coder is the set of numbers C and the specific event i.

Let $x(n)$ and $r(n)$ be a pair of real numbers which describes the result of encoding the first n events. The starting values are $x(0) = 0$ and $r(0) = 1$. The coding formulae are, to code the n'th event (event i in the set described by C) are as follows:

$$x(n) = x(n-1) + r(n-1) \frac{C(i-1,n)}{C(I(n),n)} \quad (2)$$

$$r(n) + r(n-1) \frac{[C(i,n) - C(i-1,n)]}{C(I(n),n)}$$

The formulae may become more transparent if the estimated probability and cumulative distribution functions are defined as follows:

$$p(i,n) = \frac{c(i,n)}{C(I(n),n)} \quad (3)$$

$$F(i,n) = p(1,n) + p(2,n) + \ldots + p(i,n)$$

$$F(0,n) = 0$$

In terms of the above definitions, equations (2) become the following:

$$x(n) = x(n-1) + r(n-1) F(i-1,n)$$

$$r(n) = r(n-1) p(i,n) \quad (2)$$

Figure 3:
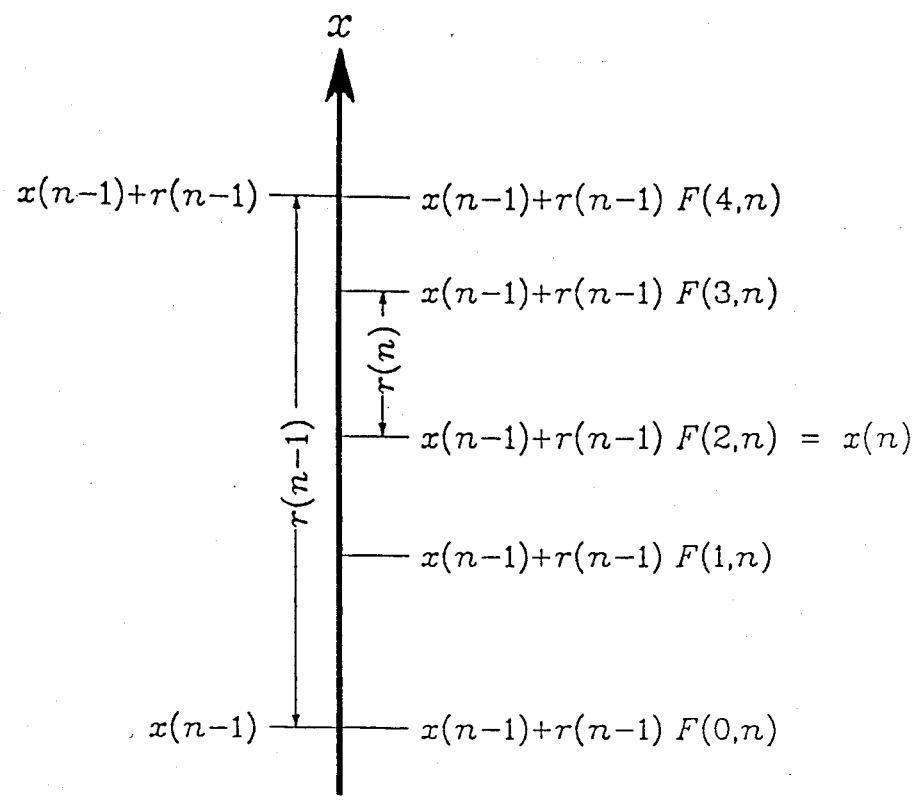
FIG. 3 is a diagrammatic illustration of coding the n'th event.

FIG. 3 shows the geometric representation of these formulae.

If the total file is described by coding N events, the document is represented by the value of x(N). The decoder is given x(N) and can, using the same model as the encoder, deduce the sequence of N events. The possibility of this decoding follows from the following:

$$x(n-1) \leq x(n) < x(n-1) + r(n-1), \quad (4)$$

for $n = 1, 2, \ldots, N$, so that $$x(n) \leq x(N) < x(n) + r(n) \quad (5)$$

which may be written as $$C(i-1,n) \leq [x(N) - x(n-1)] \frac{C(I(n),n)}{r(n-1)} < C(i,n) \quad (6)$$

Since C is a monotonic increasing function of i, only one value of i can satisfy this inequality.

The coded file is represented by the value of x(N). The number of bits required to represent x(N) with sufficient accuracy is readily estimated. Any point in the interval X defined by $$x(N) \leq X < x(N) + r(N)$$

will suffice to permit decoding the file. Thus, it is only necessary to transmit enough bits of some X in this interval to uniquely position it in the interval. Using $$\log_2 \left( \frac{1}{r(N)} \right) + 2$$

bits will accomplish this.

An examination of the formula for calculation of r shows that r is the product of the probabilities of the individual events, so that two more bits are required than the sum for all events of $$\log_2 \left( \frac{1}{p(i,n)} \right).$$

The algorithm, as described, has five event sets and five sets of counts to be maintained. These are given in the tables below:

| Set 1. Starting a new record | |
|---|---|
| Item | Initial Value |
| startword | 1 |
| startsep | 1 |

Set 2. Expecting a Word

-continued

| Item | Initial Value |
| --- | --- |
| end of record | 1 |
| new word | 1 |
| word 1 | 0 |
| word 2 | 0 |
| ... | |

| Set 3. Expecting a Character in a New Word | |
| --- | --- |
| Item | Initial Value |
| end of word | 1 |
| new character | 1 |
| character 1 | 0 |
| character 2 | 0 |
| ... | |

| Set 4. Expecting a Separator | |
| --- | --- |
| Item | Initial Value |
| end of record | 1 |
| new separator | 1 |
| separator 1 | 0 |
| separator 2 | 0 |
| ... | |
| single space | 1 |

| Set 5. Expecting a Character in a New Separator | |
| --- | --- |
| Item | Initial Value |
| end of separator | 1 |
| new character | 1 |
| character 1 | 0 |
| character 1 | 0 |
| ... | |

For an event in any of the above sets, the event will be coded using the count for the event, the sum of the counts for all events in the set above the event being coded, and the total number of events in the set. After the event is coded, the count for the event is increased by one. If the event is a new word, separator, or character, the count for the new item is set to one, it being previously zero. Note that in this case the total number of events in the set has been increased by two, each new item being a double event in the set.

In set 4, the single space (blank) is treated separately. This is for speed of execution, since in many documents the single space is the predominant separator.

The character counts in sets 3 and 5 are indexed by the corresponding EBCDIC code for the character. Since the word characters will not include those with codes of zero or one, these are used for end of word and new character, respectively. For the separator characters, any alphanumeric characters may be used to designate end of separator and new character. For example, the characters "x" and "y" may be choosen.

These tables of counts (except for set 1) are fairly large. The maximum number of items in each set is tabulated below:

| Set Number | Number of Items |
| --- | --- |
| 1 | 2 |
| 2 | 4096 |
| 3 | 64 |
| 4 | 4097 |
| 5 | 196 |

The sizes of the dictionaries (sets 2 and 4) are arbitrary. The above choice seems reasonable when compressing actual files. For sets 3 and 5, it is convenient to allow 256 entries in each of the tables, although many will not be used. This is for speed of computation.

Figure 4:
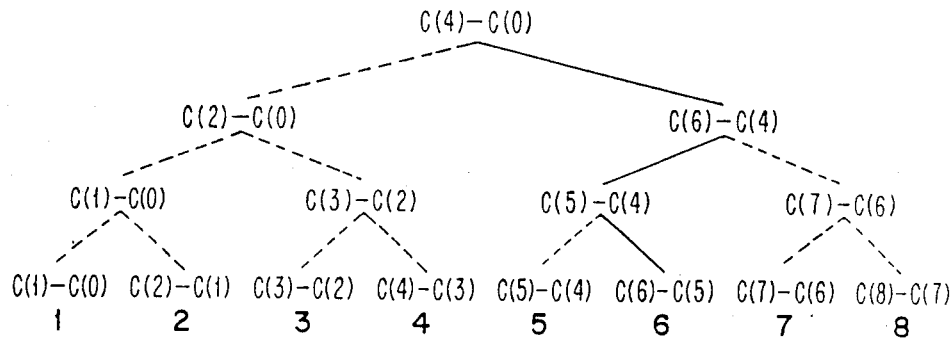
FIG. 4 is a diagrammatic illustration of the tree structure for event counts.

Updating a count for an event is a simple computation. A problem arises when the cumulative count is required. The cumulative counts are defined in equation (1). A full dictionary would require up to 4096 additions to obtain a cumulative count. Maintaining the C(i,n) for each new event would also be time consuming. A technique which solves this problem is available. The approach is indicated in FIG. 4 which is constructed for an event set of eight events. The notation is that of equation (1). Note that the depth of the tree is much smaller than the number of leaves of the tree. Thus, the updating operation requires many less steps. In practice, the tree is traversed once from the top to the desired leaf or event. First, a variable cumulative count is set to zero. During the traversal, if one goes to the left, the count at that node is increased by one. On the other hand, if one goes to the right, the value of the node is added to the cumulative count. When the bottom of the tree is reached, the leaf has the desired value of c(i,n) and the cumulative count has the value for C(i−1,n).

For large files, renormalization of the counts may be necessary, either to prevent the counts from getting too large or to keep the dictionary within bounds. Renormalization also causes a deemphasis of old statistics. The renormalization procedure is as follows. If, before an event is processed, the total count for that event set is greater than 16,000 or the event is a word or a separator and the dictionary for that event set is almost full, renormalization occurs. Each count is divided by two. For words and separators, the remainder is dropped. For other counts, rounding up occurs. For words and separators, some of the entries will go from a count of one to a count of zero. These items are pruned from the dictionary. If such an item is encountered again, it is a new word or a new separator.

The coding scheme described above is implemented for a machine with 32-bit words. The details of significance and truncation must be attended to in such a way that the decoding process can go through without error, recovering the original file.

All the calculations are carried out in terms of integers. The quantities x and r are both integers. The initial values are as follows:

$x(0) = 0$
$r(0) = 2^{31} - 1$

This value of r is the largest positive value in a machine with 32-bit words and two's complement arithmetic. x will be treated as an accumulator of arbitrary length, but addition into x will always be of numbers equal to or less than the initial value of r.

According to equation (2), r gets smaller and smaller. To maintain precision, whenever r gets too small, it is multiplied by 256. The value of x must also be multiplied by 256. This leads to the following scaling operation, which is the first step in the coding process:

$$\text{If } r(n-1) < 2^{23} \qquad (7)$$

$$r(n-1) = 256 r(n-1)$$

$$x(n-1) = 256 x(n-1)$$

Repeat

We are now ready to code the event i. In place of equation (2), use the following where [...] denotes integral part of:

$$z = \left[ r(n-1) \frac{C(i-1,n)}{C(I(n),n)} \right] \qquad (8)$$

$$u = \left[ r(n-1) \frac{C(i,n)}{C(I(n),n)} \right]$$

$$x(n) = x(n-1) + z$$

$$r(n) = r(n-1)(u-z)$$

When r and x are multiplied by 256, one might be tempted to transmit the byte of x which is shifted out to the lift of the least significant four bytes of x. This process is valid much of the time. Unfortunately, the calculation of x(n) from x(n−1) may cause a carry to the left from the four least significant bytes of x. This carry can occur at most once for each scaling of x and r. To handle this carry, x is maintained as an eight byte quantity, and the most significant of these eight bytes before multiplying by 256 is transmitted. Now the problem has been reduced to the special case where each of the four most significant bytes of x has a value of 255. Whenever this rare case occurs, the most significant four bytes of x are multiplied by 256 after transmitting the most significant byte of x. Any time x is changed, this test is made.

The algorithm will fail if r ever becomes zero. From equations (8), it is clear that this occurs only if u=z.

$$u - z = \left[ r(n-1) \frac{C(i,n)}{C(I(n),n)} \right] -$$

$$\left[ r(n-1) \frac{C(i-1,n)}{C(I(n),n)} \right] \geq \left[ r(n-1) \frac{C(i,n)}{C(I(n),n)} \right] -$$

$$\left[ r(n-1) \frac{C(i-1,n)}{C(I(n),n)} \right] \geq \left[ \frac{r(n-1)}{C(I(n),n)} \right]$$

We are safe if $C(I(n),n) < r(n-1)$.

Since r is scaled before the coding, the minimum value r can have is $2^{23}$, so all we need is that $C(I(n),n) < 2^{23}$. In the proof of inequality (12) given hereinafter which is used for decoding, the condition $2C(I(n),n) < r(n-1)$ is used so that it is necessary to require $C(I(n),n) < 2^{22}$. As has already been stated, the maximum value permitted for $C(I(n),n)$ is 16,000, which clearly satisfies the condition.

The decoding process parallels the encoding process. The value of x is obtained from the compressed data. The first four bytes of the compressed data give the initial value of x. The initial value of r is that used in encoding. The statistics for the various event sets are maintained for the decoder as they were for the encoder. Thus, whenever an event is to be decoded, the appropriate event set is known with the correct values of the C's. Renormalization and scaling of x and r are carried out as in encoding.

When decoding, the value of x is decreased as much as possible, but not permitted to become less than zero. Thus, the basic decoding formula is based on determining i such that $$\left[ r(n-1) \frac{C(i-1),n}{C(I(n),n)} \right] \leq x < \left[ r(n-1) \frac{C(i,n)}{C(I(n),n)} \right] \quad (9)$$

This i specifies the event to be selected from the event set. The new values of r and x are calculated from the following:

$$z = \left[ r(n-1) \frac{C(i-1,n)}{C(I(n),n)} \right] \quad (10)$$

$$u = \left[ r(n-1) \frac{C(i,n)}{C(I(n),n)} \right]$$

$$x(n) = x(n-1) - z$$

$$r(n) = r(n-1)(u-z)$$

When x and r are scaled in accordance with equations (7), a new byte from the coded file is added to x, right justified. If the four most recently used successive bytes in the coded message each had the value 255, the next byte is also added to x, right justified. This reverses the mechanism used to manage the carry.

The determination of i from inequality (9) is computationally undesirable, since the cumulative counts and multiple tests are needed. The tree used for managing the statistics is also used in the decoder. We attempt to find a count c such that $$C(i-1, n) \leq c < C(i,n) \quad (11)$$

Such a c may readily be used to search the tree in FIG. 4 to find the event. The determination of c is as follows. Try $$c = \left[ 2 \left( \frac{1+x}{2} \right) \frac{C(I(n),n)}{r(n-1)} \right]$$

We first show that $c \geq C(i-1,n)$. In the following, d and f are variables less than 1 and equal to or greater than zero. The variable e has the possible values of 0 and 0.5.

$$c = \left[ 2 \left( \frac{1+x}{2-e} \right) \frac{C(I(n),n)}{r(n-1)} \right]$$

$$c + d = (2 + x - 2e) \frac{C(I(n),n)}{r(n-1)}$$

$$= 2(1-e) \frac{C(I(n),)}{r(n-1)} + x \frac{C(I(n),n)}{r(n-1)}$$

From inequality (9), we obtain $$x \geq r(n-1) \frac{C(i-1,n)}{C(I(n),n) - f}$$

so that $$c + d \geq (2 - 2e - f) \frac{C(I(n),n)}{r(n-1)} + C(i-1,n)$$

$$> C(i-1,n)$$

Since c and C are integers and d is less than one, this yields $c \geq C(i-1,n)$. We now show that $c \leq C(i,n)$. We had before $$c + d = 2(1-e) \frac{C(I(n),n}{r(n-1)} + x \frac{C(I(n),n)}{r(n-1)}$$

From inequality (9), we have $$x < r(n-1)\frac{C(i,n)}{C(I(n),n)}$$

so that $$c + d < 2(1-e)\frac{C(I(n),n)}{r(n-1)} + C(i,n)$$

Since c and C(i,n) are integers and the first term on the right is less than one, we may conclude that $$c \leq C(i,n) \qquad (12)$$

We have thus shown that $C(i-1,n) \leq c \leq C(i,n)$. If $c = C(i,n)$, then, from inequality (9), $$r(n-1)\frac{c}{C(I(n),n)} > x.$$

In this case we reduce the trial value of c by one. As a result, we have a value of c which satisfies inequality (11). This value of c is used in traversing the count tree to find the event that was encoded and the associated counts needed for the calculations in equations (10).

While the invention has been particularly shown and described with respect to a preferred embodiment thereof, it will be understood by those skilled in the art that the foregoing and other changes in form and details may be made therein without departing from the spirit and scope of the invention.

Having thus described my invention, what I claim as new, and desire to secure by Letters Patent is:

1. An adaptive method of compressing character data by a computer wherein said data is divided into words and separators, comprising the steps of:
   initializing all counts and creating empty dictionaries in the computer for the words and separators;
   determining by the computer for each event in a data stream whether said event is a word or a separator;
   determining by the computer for each word event whether said word is in the dictionary of words compiled from previously encountered words or is a new word;
   determining by the computer for each separator event whether said separator is in the dictionary of separators compiled from previously encountered separators or is a new separator;
   encoding by the computer said event with a predetermined new word or new separator symbol followed by encoding by the computer the characters in the word or separator if said event is a new word or a new separator;
   maintaining in the computer a count of all word events and a count of all separator events as said events are encoded;
   maintaining in the computer individual counts for each occurence of a word and for each occurence of a separator;
   using by the computer the ratio of the number of times a word has been encountered to the total number of words encountered as an estimate of the probability of that word;
   using by the computer the estimated probabilities with a coding scheme to code the word event;
   using by the computer the ratio of the number of times a separator has been encountered to the total number of separators encountered as an estimate of the probability of that separator;
   using by the computer the estimated probabilities with a coding scheme to code the separator event; and
   repeating the above steps for all events in said data stream.

2. The method of claim 1 wherein the steps of coding the word events and the separator events by the computer are performed with arithmetic coding.

3. The method of claim 1 wherein the steps of coding the word events and the separator events are performed with the following steps:
   initializing all counts and creating empty dictionaries in the computer for word characters and separator characters;
   determining by the computer for each character in a word event or a separator event whether the character is in the dictionary of characters compiled from previously encountered characters or is a new character;
   performing said step of encoding the character if the character is a new character; and
   repeating the above steps for all characters in the word event or the separator event.

* * * * *